United States Patent
Chen et al.

(10) Patent No.: US 9,948,279 B1
(45) Date of Patent: Apr. 17, 2018

(54) ELECTRONIC DEVICE CAPABLE OF BANDWIDTH COMPENSATION AND METHOD THEREOF

(71) Applicant: NOVATEK Microelectronics Corp., Hsin-Chu (TW)

(72) Inventors: Mu-Jung Chen, Tainan (TW); Nan-Yuan Wang, Tainan (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 0 days.

(21) Appl. No.: 15/473,602

(22) Filed: Mar. 29, 2017

(51) Int. Cl.
*H03K 17/16* (2006.01)
*H03K 19/003* (2006.01)
*H03H 11/12* (2006.01)
*H03H 11/30* (2006.01)

(52) U.S. Cl.
CPC ......... *H03H 11/1278* (2013.01); *H03H 11/30* (2013.01)

(58) Field of Classification Search
CPC ..................... H03H 11/1278; H03H 11/30

USPC .......................................................... 326/30
See application file for complete search history.

(56) References Cited

U.S. PATENT DOCUMENTS

| | | | |
|---|---|---|---|
| 6,580,286 B1* | 6/2003 | Tennen | H04L 25/0266 326/30 |
| 2003/0189441 A1* | 10/2003 | Nguyen | G06F 13/4086 326/30 |
| 2014/0210545 A1* | 7/2014 | Leibowitz | G11C 5/147 327/540 |

* cited by examiner

*Primary Examiner* — Daniel D Chang
(74) *Attorney, Agent, or Firm* — Winston Hsu

(57) ABSTRACT

An electronic device capable of bandwidth compensation includes a register unit for storing a calibration code determined by performing an on-die termination (ODT) calibration process and a data receiving circuit, wherein the calibration code is utilized for controlling a termination resistance of an ODT unit. The data receiving circuit comprises a first control circuit coupled to the register unit and the active low-pass filter for generating a first control signal according to the calibration code stored in the register unit, the first control signal being utilized for adjusting a capacitance of a first feedback capacitor unit or a resistance of a first feedback resistor unit of an active low-pass filter.

17 Claims, 6 Drawing Sheets

ELECTRONIC DEVICE CAPABLE OF BANDWIDTH COMPENSATION AND METHOD THEREOF

BACKGROUND OF THE INVENTION

1. Field of the Invention

The present invention relates to an electronic device capable of bandwidth compensation and method thereof, and more particularly, to a data receiving circuit of an electronic device capable of bandwidth compensation by using a calibration code determined by performing an on-die termination (ODT) calibration process and method thereof.

2. Description of the Prior Art

FIG. 1 illustrates a signal transmission system 1 of the prior art. The signal transmission system 1 includes a transmitter TX and a receiver RX which are installed in different electronic devices. The receiver RX includes an on-die termination (ODT) unit 12 and an active low-pass filter 10. The ODT unit 12 is coupled to the transmitter TX and the active low-pass filter 10, and includes a tunable resistor that is adjusted in order to match an input impedance of the receiver RX with an output impedance of the transmitter TX. The active low-pass filter 10 is used for amplifying the received signal and attenuating high frequency noise from the received signal.

For a high speed signal transmission interface between the transmitter TX and the receiver RX, the output impedance of the transmitter TX and the input impedance of the receiver RX shall be matched to maximize the power transfer and minimize the signal reflection, and the high frequency noise shall be filtered out to ensure signal quality of the received signal. Therefore, the input impedance of the receiver RX and a bandwidth of the active low-pass filter 10 shall be controlled within a specific and precise range to ensure the quality of the received signal.

However, in fabrication of integrated circuits, electrical characteristics (e.g., resistance and capacitance) of the elements comprised in the receiver RX may be variable due to process variation, which is also known as process drift. Since the bandwidth of the active low-pass filter 10 is determined by its feedback resistance and feedback capacitance, the process variation further causes the bandwidth variation of the active low-pass filter 10.

To compensate for the bandwidth variation due to the process variation, the receiver RX further includes a calibration circuit for detecting the bandwidth variation of the active low-pass filter 10 and accordingly adjusting the electrical characteristics of the elements. However, extra circuit area is required for the calibration circuit, which increases cost of the receiver RX.

Therefore, how to compensate for the bandwidth variation due to the process variation without the extra calibration circuit has become a topic in the industry.

SUMMARY OF THE INVENTION

It is therefore an objective of the present invention to provide an electronic device capable of bandwidth compensation and method thereof.

The present invention discloses an electronic device capable of bandwidth compensation. The electronic device includes a register unit and a data receiving circuit. The register unit is used for storing a calibration code determined by performing an ODT calibration process, wherein the calibration code is utilized for controlling a termination resistance of an ODT unit. The data receiving circuit includes an active low-pass filter and a first control circuit. The active low-pass filter includes an operational amplifier, a first feedback resistor unit, a first feedback capacitor unit, and a first input resistor unit. The first control circuit is coupled to the register unit and the active low-pass filter, for generating a first control signal according to the calibration code stored in the register unit, and the first control signal is utilized for adjusting a capacitance of the first feedback capacitor unit or a resistance of the first feedback resistor unit of the active low-pass filter.

The present invention further discloses a method of bandwidth compensation for a data receiving circuit of an electronic device. The method includes performing an on-die termination (ODT) calibration process to determine a calibration code to control the termination resistance of an ODT unit in the data receiving circuit, and adjusting a capacitance of a first feedback capacitor unit or a resistance of a first feedback resistor unit, of an active low-pass filter of the data receiving circuit, according to the determined calibration code.

The present invention adjusts the bandwidth of the active low-pass filter by adjusting at least one the capacitance of the feedback capacitor units and the resistance of the feedback resistor units, to compensate for the bandwidth variation based on the determined calibration code that indicates the percentage variation of the on-die termination resistance. Since the bandwidth variation is compensated based on the determined calibration code, there is no extra circuit area required for the calibration circuit, which saves cost of the electronic device.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
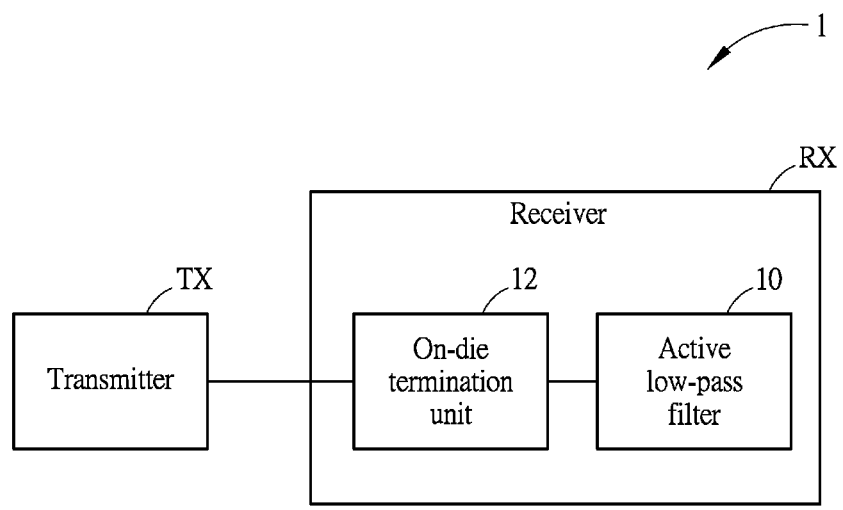
FIG. 1 illustrates a signal transmission system of the prior art.
Figure 2:
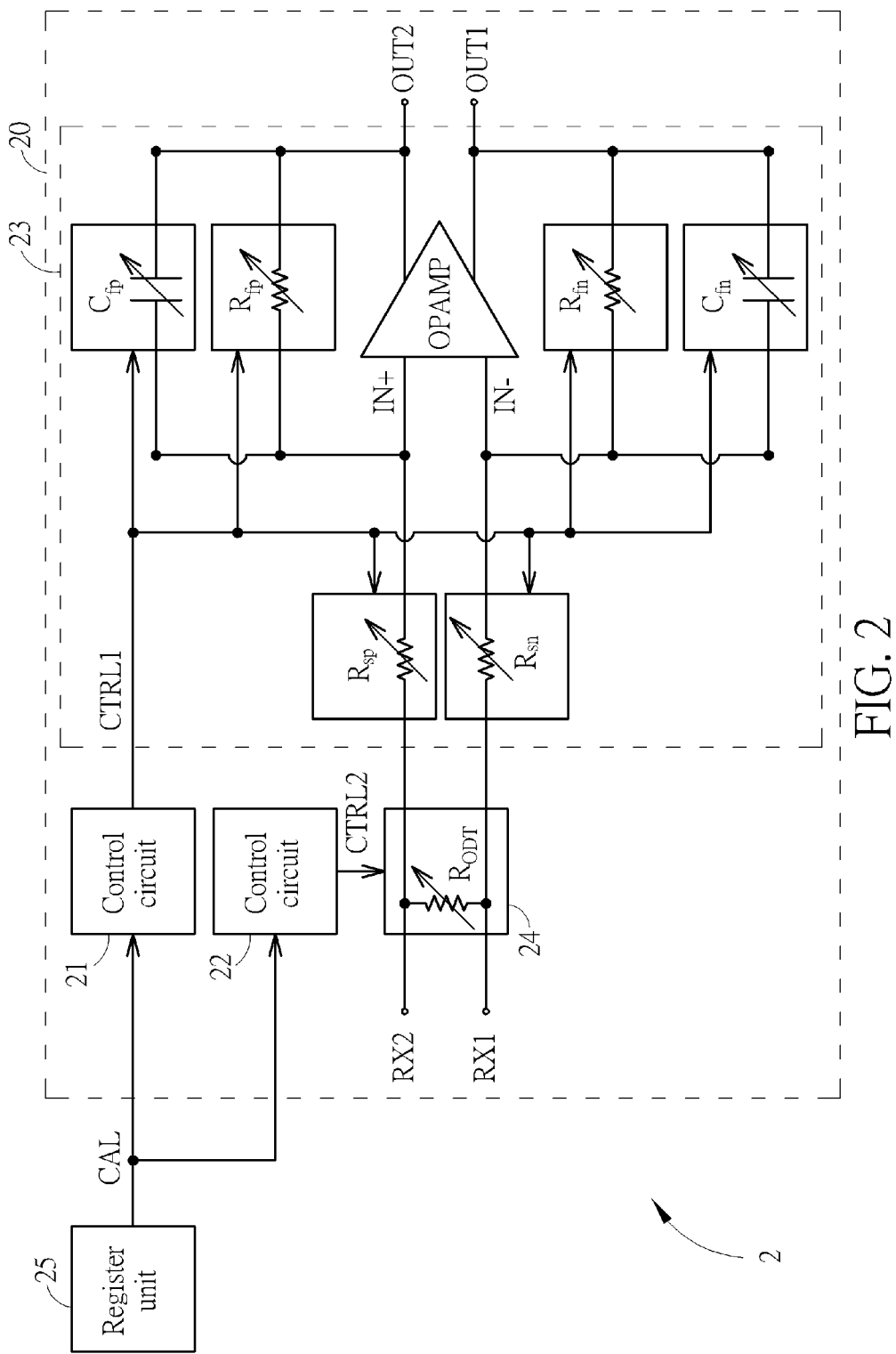
FIG. 2 is a schematic diagram of an electronic device according to an embodiment of the present invention.

FIG. 2 is a schematic diagram of an electronic device 2 according to an embodiment of the present invention. The electronic device 2 may be, but not limited to, a display controller integrated circuit, and the electronic device 2 may include a data receiving circuit (or called data receiver) 20 and a register unit 25. The data receiving circuit 20 may be used for receiving data through a transmission interface, such as an Ethernet interface or other interface conforming to other standard. The data receiving circuit 20 includes control circuits 21 and 22, an active low-pass filter 23, and an on-die termination (ODT) unit 24. The ODT unit 24 may include a parallel resistor circuit with switches, and the number of parallel coupled resistors in the ODT unit 24 is able to be adjusted.

In semiconductor fabrication, after the integrated circuit of the electronic device 2 are packaged, the electronic device 2 may be connected to a testing equipment (not shown) to perform a series of testing procedures, including an on-die termination calibration process, before the electronic device 2 is shipped to a customer side. In the ODT calibration process, the input impedance of the data receiving circuit 20 of the electronic device 2 is calibrated by adjusting a termination resistance $R_{ODT}$ of an on-die termination (ODT) unit 24 in order to conform to the specified input impedance. In an exemplary ODT calibration process, the testing equipment generates a test current to input terminals RX1 and RX2 of the data receiving circuit 20 of the electronic device 2 that connects to the ODT unit 24, and the testing equipment generates calibration codes (which is also known as trimming codes), for example 3-bits calibration codes 000 to 111, to adjust the termination resistance $R_{ODT}$ of the ODT unit 24 to be at different configurations (e.g., different number of parallel resistors included in the ODT unit 24) and measures a voltage difference between the terminals RX1 and RX2 under the said different configurations to obtain respective termination resistances. The testing equipment may calculate, with respect to each calibration code, a resistance difference between the termination resistance $R_{ODT}$ and the specified input resistance of the data receiving circuit 20 such that a calibration code which makes the termination resistance $R_{ODT}$ the most approximate to the specified input resistance of the data receiving circuit 20 is determined. The determined calibration code is denoted by CAL hereinafter. It is noted that the resistance difference between the termination resistance $R_{ODT}$ and the specified input resistance of the data receiving circuit 20 may be caused by process drift, and this resistance difference may be represented as a percentage variation.

After the ODT calibration process has been performed, the calibration code CAL is stored in the register unit 25. The control circuit 22 is coupled to the ODT unit 24 and the register unit 25, and is utilized for generating a control signal CTRL2 according to the calibration code CAL to control the termination resistance $R_{ODT}$ of the ODT unit 24 to be a fixed resistance.

Table 1 illustrates an exemplary relationship between 3-bits calibration codes and the percentage variation of the termination resistance $R_{ODT}$ of the ODT unit 24. The percentage variation of the termination resistance $R_{ODT}$ of the ODT unit 24 represents the difference between the termination resistance $R_{ODT}$ and the specified input resistance of the data receiving circuit 20 divided by the specified input resistance, and is abbreviated to $R_{ODT}$ percentage variation hereinafter. Table 1 is just an ideal example so the $R_{ODT}$ percentage variations seem to have equal difference step size (e.g., 5%). A real implementation of the ODT unit 24 is not limited to having equal difference step size in the $R_{ODT}$ percentage variations.

TABLE 1

| Code [2:0] | $R_{ODT}$ Variation (%) |
|---|---|
| 000 | +20 |
| 001 | +15 |
| 010 | +10 |
| 011 | +5 |
| 100 | 0 |
| 101 | −5 |
| 110 | −10 |
| 111 | −15 |

In the example of Table 1, the calibration code 100 is a default calibration code corresponding to $R_{ODT}$ percentage variation 0%, which means ideally (i.e., without the process drift) the calibration code 100 may control the termination resistance $R_{ODT}$ to conform to the specified input resistance of the data receiving circuit 20. The ODT unit 24 is configured to an initial state (before the ODT calibration process is performed) according to the default calibration code.

By performing the ODT calibration process, the calibration code CAL which makes the termination resistance $R_{ODT}$ the most approximate to the specified input resistance of the data receiving circuit 20 is determined from code 000 to code 111. For example, if the calibration code CAL is 000 corresponding to the $R_{ODT}$ percentage variation +20%, which indicates that the actual termination resistance $R_{ODT}$ may be 20% larger than the specified input resistance of the data receiving circuit 20, the calibration code CAL being 000 may control the termination resistance $R_{ODT}$ to be decreased by 20% to be approximate to the specified input resistance of the data receiving circuit 20. For example, if the calibration code CAL is 110 corresponding to the $R_{ODT}$ percentage variation −10%, which indicates that the actual termination resistance $R_{ODT}$ is 10% smaller than the specified input resistance of the data receiving circuit 20, the calibration code CAL being 110 may control the termination resistance $R_{ODT}$ to be increased by 10% to be approximate to the specified input resistance of the data receiving circuit 20. For example, if the calibration code CAL is 100 corresponding to the percentage variation 0%, which indicates the $R_{ODT}$ percentage variation may be within a tolerance range and may be omitted, the calibration code CAL being 100 may control the termination resistance $R_{ODT}$ to be a default resistance.

The control circuit 21 is coupled to the register unit 25 and the active low-pass filter 23, for generating a control signal CTRL1 according to the calibration code CAL stored in the register unit 25, wherein the control signal CTRL1 is utilized for adjusting capacitance of feedback capacitor units $C_{fn}$ and $C_{fp}$ or resistance of the feedback resistor units $R_{fn}$ and $R_{fp}$.

The active low-pass filter 23 is coupled to the control circuit 21 and the ODT unit 24, and includes an operational amplifier OPAMP, the feedback resistor units $R_{fn}$ and $R_{fp}$, the feedback capacitor units $C_{fn}$ and $C_{fp}$, and input resistor units $R_{fn}$ and $R_{sp}$. The operational amplifier OPAMP includes an inverting input terminal IN−, a non-inverting input terminal IN+, and output terminals OUT1 and OUT2. The feedback resistor units $R_{fn}$ and $R_{fp}$ may be adjustable to generate different resistances. The feedback capacitor units $C_{fn}$ and $C_{fp}$ may be adjustable to generate different capacitances. Note that the active low-pass filter 23 is a differential active low-pass filter.

One terminal of the input resistor unit $R_{sn}$ is coupled to one terminal of the ODT unit 24 and the input terminal RX1 of the data receiving circuit 20, and another terminal of the input resistor unit $R_{sn}$ is coupled to the inverting input terminal IN− of the operational amplifier OPAMP. One terminal of the input resistor unit $R_{sp}$ is coupled to another terminal of the ODT unit 24 and the input terminal RX2 of the data receiving circuit 20, and another terminal of the input resistor unit $R_{sp}$ is coupled to the non-inverting input terminal IN+ of the operational amplifier OPAMP.

One terminal of the feedback resistor unit $R_{fn}$ is coupled to the inverting input terminal IN− of the operational amplifier OPAMP and another terminal of the feedback resistor unit $R_{fn}$ is coupled to the output terminal OUT1 of the operational amplifier OPAMP. One terminal of the feedback resistor unit $R_{fp}$ is coupled to the non-inverting input terminal IN+ of the operational amplifier OPAMP and another terminal of the feedback resistor unit $R_{fp}$ is coupled to the output terminal OUT2 of the operational amplifier OPAMP.

One terminal of the feedback capacitor unit $C_{fn}$ is coupled to the inverting input terminal IN− of the operational amplifier OPAMP, and another terminal of the feedback capacitor unit $C_{fn}$ is coupled to the output terminal OUT1 of the operational amplifier OPAMP. One terminal of the feedback capacitor unit $C_{fp}$ is coupled to the non-inverting input terminal IN+ of the operational amplifier OPAMP and another terminal of the feedback capacitor unit $C_{fp}$ is coupled to the output terminal OUT2 of the operational amplifier OPAMP.

The bandwidth of the active low-pass filter 23 equals $1/(2*\pi*R_{fp}*C_{fp})$, or $1/(2*\pi*R_{fn}*C_{fn})$, and a gain of the active low-pass filter 23 equals $R_{fp}/R_{sp}$ or $R_{fn}/R_{sn}$. The symbols $R_{fp}$, $R_{fn}$, $R_{sp}$, $R_{sn}$, $C_{fp}$, and $C_{fn}$ denote the components and also denotes the resistances and capacitances.

Based on a fact that the ODT unit 24 and the feedback resistor units of the active low-pass filter 23 are fabricated in the same semiconductor fabrication process (such that the process drift may have similar influence on resistors included in the ODT unit 24 and included in the feedback resistor units), the $R_{ODT}$ percentage variation may be taken as the percentage variation of the resistance of the feedback resistor units $R_{fp}$ and $R_{fn}$ of the active low-pass filter 23. Since the process drift results in the bandwidth variation of the active low-pass filter 23, the bandwidth of the active low-pass filter 23 may be compensated based on resistance variation of the feedback resistor units $R_{fp}$ and $R_{fn}$, which may be represented by the $R_{ODT}$ percentage variation.

Accordingly, the bandwidth of the active low-pass filter 23 can be compensated by adjusting at least one of the capacitance of the feedback capacitor units $C_{fn}$ and $C_{fp}$ and the resistance of the feedback resistor units $R_{fn}$ and $R_{fp}$ based on the calibration code CAL determined by performing the ODT calibration process, which indicates the $R_{ODT}$ percentage variation. When the calibration code CAL is different from the default calibration code, the capacitance of the first feedback capacitor unit, or the resistance of the first feedback capacitor unit, is adjusted according to the calibration code CAL.

In one embodiment of the present invention, when the calibration code CAL is different from the default calibration code, the bandwidth of the active low-pass filter 23 is compensated by adjusting the capacitance of the feedback capacitor units $C_{fn}$ and $C_{fp}$ according to the control signal CTRL1 generated based on the calibration code CAL. In detail, when the calibration code CAL is corresponding to a $R_{ODT}$ percentage variation greater than a upper boundary value of a range (which implies that the actual resistance of the feedback resistor units $R_{fn}$ and $R_{fp}$ may have a positive variation large enough), the capacitance of the feedback capacitor units $C_{fn}$ and $C_{fp}$ may be decreased according to the control signal CTRL1 generated based on the calibration code CAL. On the other side, when the calibration code CAL is corresponding to a $R_{ODT}$ percentage variation smaller than a lower boundary value of the range (which implies that the actual resistance of the feedback resistor units $R_{fn}$ and $R_{fp}$ may have a negative variation large enough), the capacitance of the feedback capacitor units $C_{fn}$ and $C_{fp}$ may be increased according to the control signal CTRL1 generated based on the calibration code CAL.

The decreased amount or increased amount of the capacitance of the feedback capacitor units depends on the circuit design of the feedback capacitor units and the expected bandwidth. In an embodiment, the feedback capacitance may be decreased (or increased) according to the control signal CTRL1 by a percentage that is substantially the same as or relatively close to an absolute value of the $R_{ODT}$ percentage variation. In other words, the feedback capacitance may be decreased (or increased) according to the control signal CTRL1 by any proper percentage as long as it helps bandwidth compensation.

Table 2 illustrates an exemplary relationship between 3-bits calibration codes and corresponding feedback resistances predicted based on the $R_{ODT}$ percentage variation, the feedback capacitance without adjustment, estimated bandwidth of the active low-pass filter 23 and estimated bandwidth variation. The percentage variation noted in parentheses after the feedback resistance indicates the $R_{ODT}$ percentage variation shown in Table 1, and may be taken as the percentage variation of the resistance of the feedback resistor units $R_{fp}$ and $R_{fn}$ of the active low-pass filter 23.

TABLE 2

| Code | $R_f$ (Ohm) | $C_f$ (pF) | BW (MHz) | BW variation (%) |
|---|---|---|---|---|
| 000 | 4800 (+20%) | 300 | 110.52 | −16.67 |
| 001 | 4600 (+15%) | 300 | 115.33 | −13.04 |
| 010 | 4400 (+15%) | 300 | 120.57 | −9.09 |
| 011 | 4200 (+5%) | 300 | 126.31 | −4.76 |
| 100 | 4000 (0) | 300 | 132.63 | 0 |
| 101 | 3800 (−5%) | 300 | 139.61 | +5.26 |
| 110 | 3600 (−10%) | 300 | 147.37 | +11.11 |
| 111 | 3400 (−15%) | 300 | 156.03 | +17.65 |

As shown in Table 2, when the percentage variation of the feedback resistance is larger, the percentage variation of the bandwidth of the active low-pass filter 23 is also larger.

Table 3 illustrates an exemplary relationship between 3-bits calibration codes and corresponding feedback resistances predicted based on the $R_{ODT}$ percentage variation, the feedback capacitance with adjustment according to an embodiment of the present invention, estimated bandwidth of the active low-pass filter 23 and estimated bandwidth variation.

TABLE 3

| Code | $R_f$ (Ohm) | $C_f$ (pF) | BW (MHz) | BW variation (%) |
|---|---|---|---|---|
| 000 | 4800 (+20%) | 240 (−20%) | 138.16 | +4.17 |
| 001 | 4600 (+15%) | 255 (−15%) | 135.68 | +2.30 |
| 010 | 4400 (+15%) | 270 (−10%) | 133.97 | +1.01 |
| 011 | 4200 (+5%) | 285 (−5%) | 132.96 | +0.25 |
| 100 | 4000 (0) | 300 (0) | 132.63 | 0 |
| 101 | 3800 (−5%) | 315 (+5%) | 132.96 | +0.25 |
| 110 | 3600 (−10%) | 330 (+10%) | 133.97 | +1.01 |
| 111 | 3400 (−15%) | 345 (+15%) | 135.68 | +2.30 |

According to Table 3, when the calibration code CAL is 000 corresponding to the percentage variation +20%, which implies that the actual feedback resistances may be 20% larger than the ideal feedback resistances, the calibration code CAL being 000 may be used for adjusting the feedback capacitances to be decreased by 20% from a default capacitance 300 pF to 240 pF. In such a case, the bandwidth of the active low-pass filter 23 is compensated to be 138.16 MHz and results in a bandwidth variation 4.17%, which is relatively smaller than the absolute bandwidth variation 16.67% without bandwidth compensation as shown in Table 2.

In another example, when the calibration code CAL is 110 corresponding to the percentage variation −10%, which implies that the actual feedback resistances may be 10% smaller than the ideal feedback resistances, the calibration code being 110 may be used for adjusting the feedback capacitances to be increased by 10% from the default capacitance 300 pF to 330 pF. In such a case, the bandwidth of the active low-pass filter 23 is compensated to be 133.97 MHz and results in a bandwidth variation 1.01% which is relatively smaller than the absolute bandwidth variation 11.11% without bandwidth compensation as shown in Table 2.

In another example, when the calibration code CAL is 100 corresponding to the percentage variation 0%, which implies that the actual feedback resistances may be approximate to the ideal feedback resistances and the bandwidth of the active low-pass filter 23 is not necessary to be compensated, the calibration code being 100 may be used for maintaining the feedback capacitance in the default capacitance 300 pF.

In another embodiment of the present invention, when the calibration code CAL is different from the default calibration code, the bandwidth of the active low-pass filter 23 is compensated by adjusting the resistance of the feedback resistor units $R_{fn}$ and $R_{fp}$. Meanwhile, the resistance of the input resistor units $R_{sn}$ and $R_{sp}$ are adjusted to keep the gain of the active low-pass filter 23 substantially the same. In detail, when the calibration code CAL is corresponding to a $R_{ODT}$ percentage variation greater than a upper boundary value of the range (which implies that the actual resistance of the feedback resistor units $R_{fn}$ and $R_{fp}$ may have a positive variation large enough), the resistance of the feedback resistor units $R_{fn}$ and $R_{fp}$ and the resistance of the input resistor units $R_{sn}$ and $R_{sp}$ may be decreased according to the control signal CTRL1 generated based on the calibration code CAL. On the other side, when the calibration code CAL is corresponding to a $R_{ODT}$ percentage variation smaller than a lower boundary value of the range (which implies that the actual resistance of the feedback resistor units $R_{fn}$ and $R_{fp}$ may have a negative variation large enough), the resistance of the feedback resistor units $R_{fn}$ and $R_{fp}$ and the resistance of the input resistor units $R_{sn}$ and $R_{sp}$ may be increased according to the control signal CTRL1.

The decreased amount or increased amount of the resistance of the feedback resistor units depends on the circuit design of the feedback resistor units and the expected bandwidth. In an embodiment, the feedback resistance may be decreased (or increased) according to the control signal CTRL1 by a percentage that is substantially the same as or relatively close to an absolute value of the $R_{ODT}$ percentage variation. In other words, the feedback resistance may be decreased (or increased) according to the control signal CTRL1 by any percentage as long as it helps the bandwidth compensation. It is not necessary to implement the feedback capacitor units $C_{fn}$ and $C_{fp}$ to be adjustable when the active low-pass filter 23 is implemented to compensate for the bandwidth variation by adjusting the resistance of the feedback resistor units $R_{fn}$ and $R_{fp}$.

Figure 3:
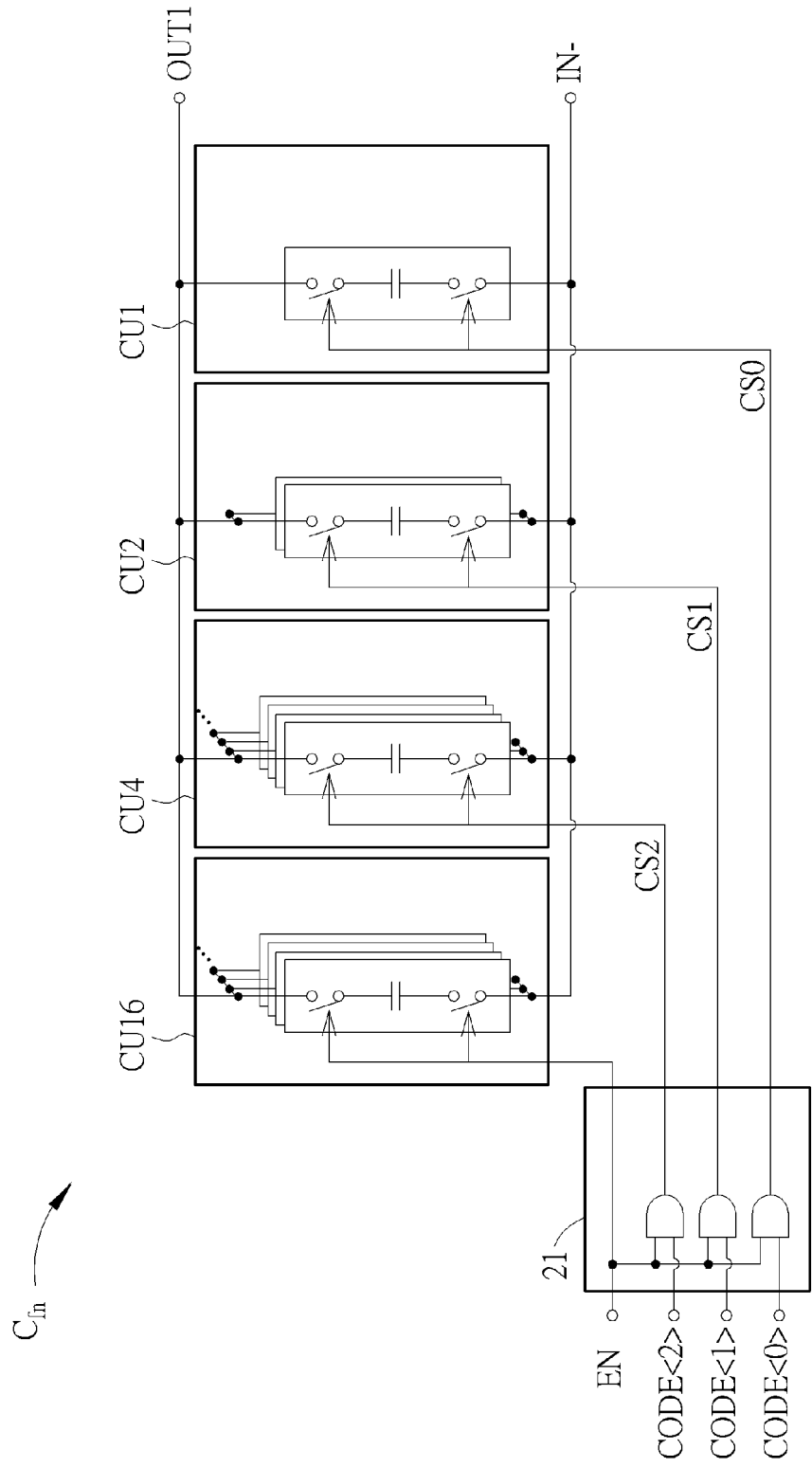
FIG. 3 is a schematic diagram of the feedback capacitor unit of FIG. 2 according to an embodiment of the present invention.

FIG. 3 is a schematic diagram of the feedback capacitor unit $C_{fn}$ (or $C_{fp}$) according to an embodiment of the present invention. The feedback capacitor unit $C_{fn}$ includes a plurality of capacitors. The active low-pass filter 23 further includes a plurality of switches utilized for controlling the number of capacitors which are parallel coupled between the inverting input terminal IN− of the operational amplifier OPAMP and the output terminal OUT1 of the operational amplifier OPAMP according to the control signal CTRL1. The plurality of capacitors is divided into four groups, denoted CU1, CU2, CU4 and CU16, respectively including 1, 2, 4 and 16 units, and each unit includes one capacitor and two switches. The control circuit 21 receives an enable signal EN indicating that the electronic device 2 is power-on and three code bits CODE<0>, CODE<1> and CODE<2> which are the least significant bit to the most significant bit of the calibration code CAL determined by performing the ODT calibration process. The control circuit 21 generates three sub-control signals CS0, CS1 and CS2 to respectively control switches in the groups CU1, CU2 and CU4, and the control circuit 21 outputs the enable signal EN to control switches in the group CU16. In the example of FIG. 3, the control signal CTRL1 may be regarded as a set of signals, including the enable signal EN and the sub-control signals CS0-CS2.

Before the capacitance of the feedback capacitor units $C_{fn}$ and $C_{fp}$ is adjusted, the feedback capacitor units may be configured to have a default feedback capacitance. Based on the example of Table 1, the enable signal EN and the sub-control signals CS0-CS2 generated according to the default calibration code being 100 (i.e., CODE<0> being 0, CODE<1> being 0, and CODE<2> being 1) may configure feedback capacitor units to have a default feedback capacitance. The enable signal EN turns on the switches in the group CU16 such that 16 capacitors are parallel coupled, the sub-control signal CS2 turns on the switches in the group CU4 such that 4 capacitors are parallel coupled, and the sub-control signals CS1 and CS0 turns off the switches in the group CU2 and CU1, to make total 20 capacitors parallel coupled to generate the default feedback capacitance.

Based on the example of Table 1, when the calibration code CAL determined by the ODT calibration process is 100, which indicates that the $R_{ODT}$ percentage variation is approximate to 0 and the bandwidth of the active low-pass filter 23 is not required to be compensated, the enable signal EN and the sub-control signals CS0-CS2 controls the feedback capacitor units to be 20 capacitors parallel coupled to maintain the default feedback capacitance.

Based on example of Table 1, when the calibration code CAL is 000, which indicates that the $R_{ODT}$ percentage variation is +20%, the calibration code CAL being 000 may be used for adjusting the feedback capacitances to be decreased by 20%. In such a case, the enable signal EN turns on the switches in the group CU16 such that 16 capacitors are parallel coupled and the sub-control signals CS2, CS1 and CS0 turns off all the switches in the groups CU4, CU2 and CU1, to make total 16 capacitors parallel coupled. As a result, the feedback capacitance is decreased by 20% since the number of parallel coupled capacitors in the feedback capacitor unit is decreased from 20 to 16.

Similarly, based on example of Table 1, when the calibration code CAL is 110, which indicates that the $R_{ODT}$ percentage variation is −10%, the calibration code CAL being 110 may be used for adjusting the feedback capacitances to be increased by 10%. In such a case, the enable signal EN turns on the switches in the group CU16 such that 16 capacitors are parallel coupled and the sub-control signals CS2 and CS1 turns on the switches in the groups CU4 and CU2, to make total 22 capacitors parallel coupled. As a result, the feedback capacitance is increased by 10% since the number of parallel coupled capacitors in the feedback capacitor unit is increased from 20 to 22.

Figure 4:
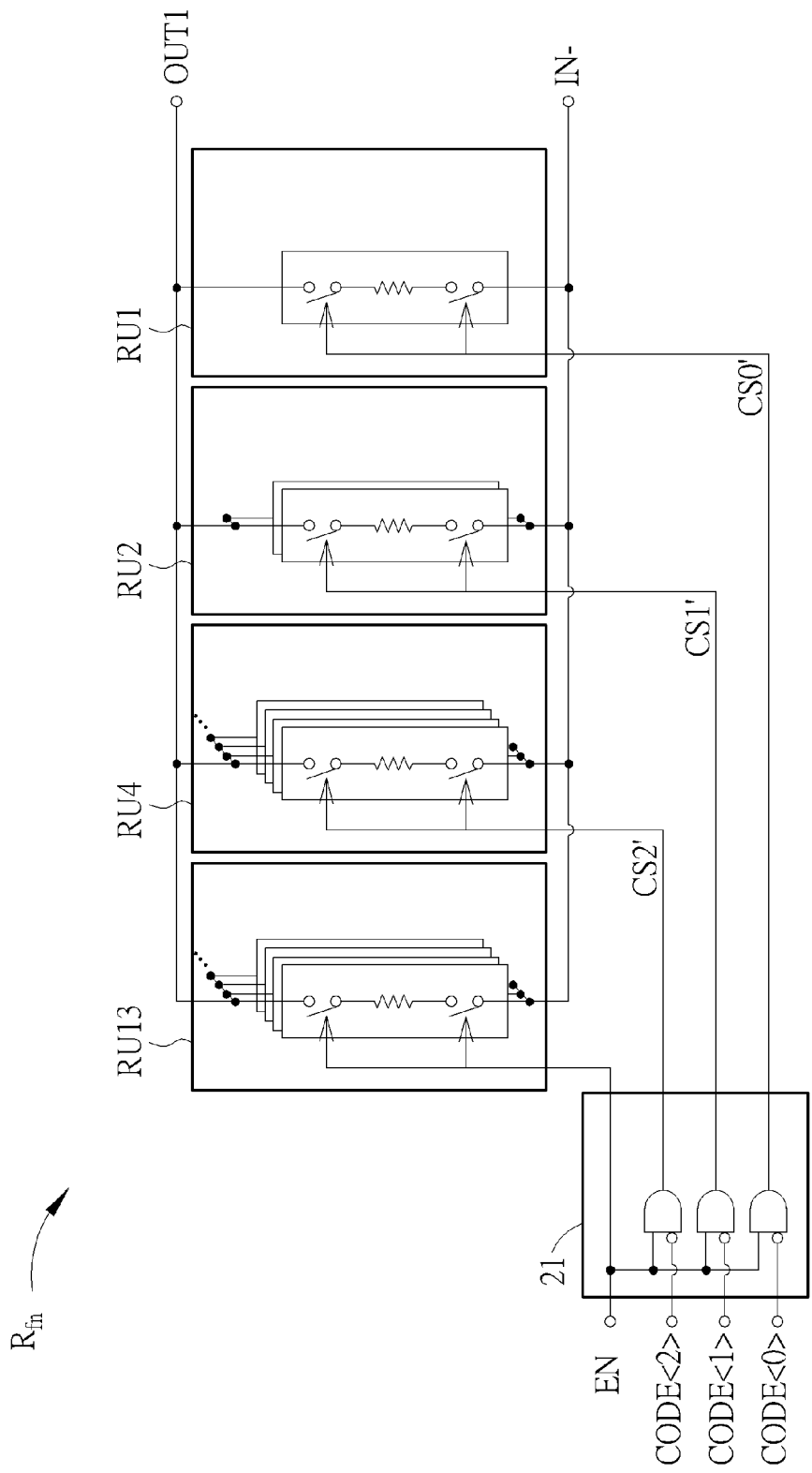
FIG. 4 is a schematic diagram of the feedback resistor unit of FIG. 2 according to an embodiment of the present invention.

FIG. 4 is a schematic diagram of the feedback resistor unit $R_{fn}$ (or $R_{fp}$) according to an embodiment of the present invention. The feedback capacitor unit $R_{fn}$ includes a plurality of resistors. The active low-pass filter 23 further includes a plurality of switches utilized for controlling the number of resistors which are parallel coupled between the inverting input terminal IN− and the output terminal OUT1 of the operational amplifier OPAMP according to the control signal CTRL1. The plurality of resistors is divided into four groups, denoted RU1, RU2, RU4 and RU13, respectively including 1, 2, 4 and 13 units, and each unit includes one resistor and two switches.

The control circuit 21 receives an enable signal EN indicating that the electronic device 2 is power-on and three code bits CODE<0>, CODE<1> and CODE<2> which are the least significant bit to the most significant bit of the calibration code CAL. The control circuit 21 generates three sub-control signals CS0', CS1' and CS2' to respectively control switches in the groups RU1, RU2 and RU4, and the control circuit 21 outputs the enable signal EN to control switches in the group RU13. In the example of FIG. 4, the control signal CTRL1 may be regarded as a set of signals, including the enable signal EN and the sub-control signals CS0'-CS2'.

It is noted the control circuit 21 of FIG. 4 for generating the sub-control signals CS0'-CS2' controlling the feedback resistor units may be different from the control circuit 21 of FIG. 3 for generating the sub-control signals CS0-CS2 controlling the feedback capacitor units. Based on the control circuit 21 of FIG. 4, the sub-control signal CS2' is the inverse signal of CODE<2>, so are the sub-control signals CS1' and CS0'. The circuit design of the feedback resistor units may take the ODT unit 24 as a reference so that the feedback resistor units are able to be adjusted to compensate for the process drift.

Before the resistance of the feedback resistor units $R_{fn}$ and $R_{fp}$ is adjusted, the feedback resistor units may be configured to have a default feedback resistance. Based on the example of Table 1, the enable signal EN and the sub-control signals CS0'-CS2' generated according to the default calibration code being 100 may configure feedback resistor units to have a default feedback resistance. The enable signal EN turns on the switches in the group RU13 such that 13 resistors are parallel coupled, the sub-control signal CS2 turns off the switches in the group RU4, and the sub-control signals CS1 and CS0 turns on the switches in the group RU2 and RU1, to make total resistors parallel coupled to generate the default feedback resistance.

Based on the example of Table 1, when the calibration code CAL determined by the ODT calibration process is 100, which indicates that the $R_{ODT}$ percentage variation is approximate to 0 and the bandwidth of the active low-pass filter 23 is not required to be compensated, the enable signal EN and the sub-control signals CS0'-CS2' controls the feedback resistor units to be 16 resistors parallel coupled to maintain the default feedback resistance. In this case the resistance of the input resistor units $R_{sn}$ and $R_{sp}$ is controlled to maintain the default input resistance of the active low-pass filter 23.

Based on example of Table 1, when the calibration code CAL is 000, which indicates that the $R_{ODT}$ percentage variation is +20%, the calibration code CAL being 000 may be used for adjusting the feedback resistance to be decreased. In the example of FIG. 4, the enable signal EN turns on the switches in the group RU13 such that 13 resistors are parallel coupled and the sub-control signals CS0'-CS2' turns on all the switches in the groups RU4, RU2 and RU1, to make total 20 capacitors parallel coupled. As a result, the feedback resistance is decreased by 20% since the number of parallel coupled resistors in the feedback resistor unit is increased from 16 to 20.

Similarly, based on example of Table 1, when the calibration code CAL is 110, which indicates that the $R_{ODT}$ percentage variation is −10%, the calibration code CAL being 110 may be used for adjusting the feedback resistance (and the input resistance) to be increased. In the example of FIG. 4, the enable signal EN turns on the switches in the group RU13, the sub-control signals CS2' and CS1' turn off the switches in the groups RU4 and RU2 and the sub-control signal CS0' turns on the one switch in the groups RU1 to make total 14 resistors parallel coupled. As a result, the feedback resistance is increased by 14.3% since the number of parallel coupled resistors in the feedback resistor unit is decreased from 16 to 14.

Figure 6:
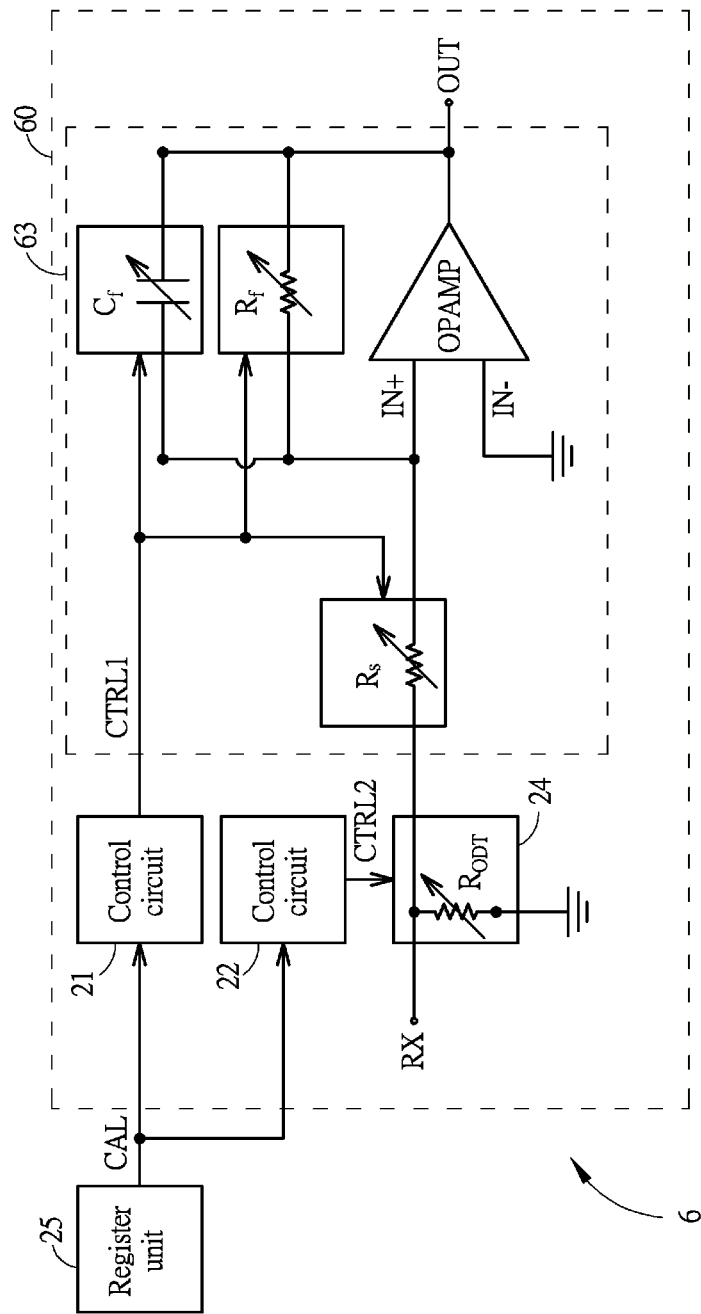
FIG. 6 is a schematic diagram of an electronic device according to an embodiment of the present invention.

In one embodiment, the active low-pass filter 23 of FIG. 2 may be replaced by a single-ended active low-pass filter 63 as shown in FIG. 6. FIG. 6 is a schematic diagram of an electronic device 6 according to an embodiment of the present invention. The electronic device 6 may include a data receiving circuit 60 and the register unit 25. The testing equipment generates a test current to an input terminal RX of the data receiving circuit 60. The data receiving circuit 60 includes the control circuits 21 and 22, the single-ended active low-pass filter 63, and the ODT unit 24. The single-ended active low-pass filter 63 includes an input resistor unit $R_S$ coupled to the inverting input terminal of the operational amplifier, and a feedback capacitor unit $C_f$ (similar to the feedback capacitor unit $C_{fn}$) and a feedback resistor unit $R_f$ (similar to the feedback resistor unit $R_{fn}$) coupled between the inverting input terminal and an output terminal OUT of the operational amplifier. In such a case, a bandwidth of the single-ended active low-pass filter 63 may be compensated by adjusting the capacitance of the feedback capacitor unit $C_f$ or adjusting the resistor of the feedback resistor unit $R_f$ according to the control signal CTRL1 which is generated based on the calibration code CAL determined by performing the ODT calibration process. A gain of the single-ended active low-pass filter is maintained by adjusting the resistance of the feedback resistor unit $R_f$ and the input resistor unit $R_S$.

Figure 5:
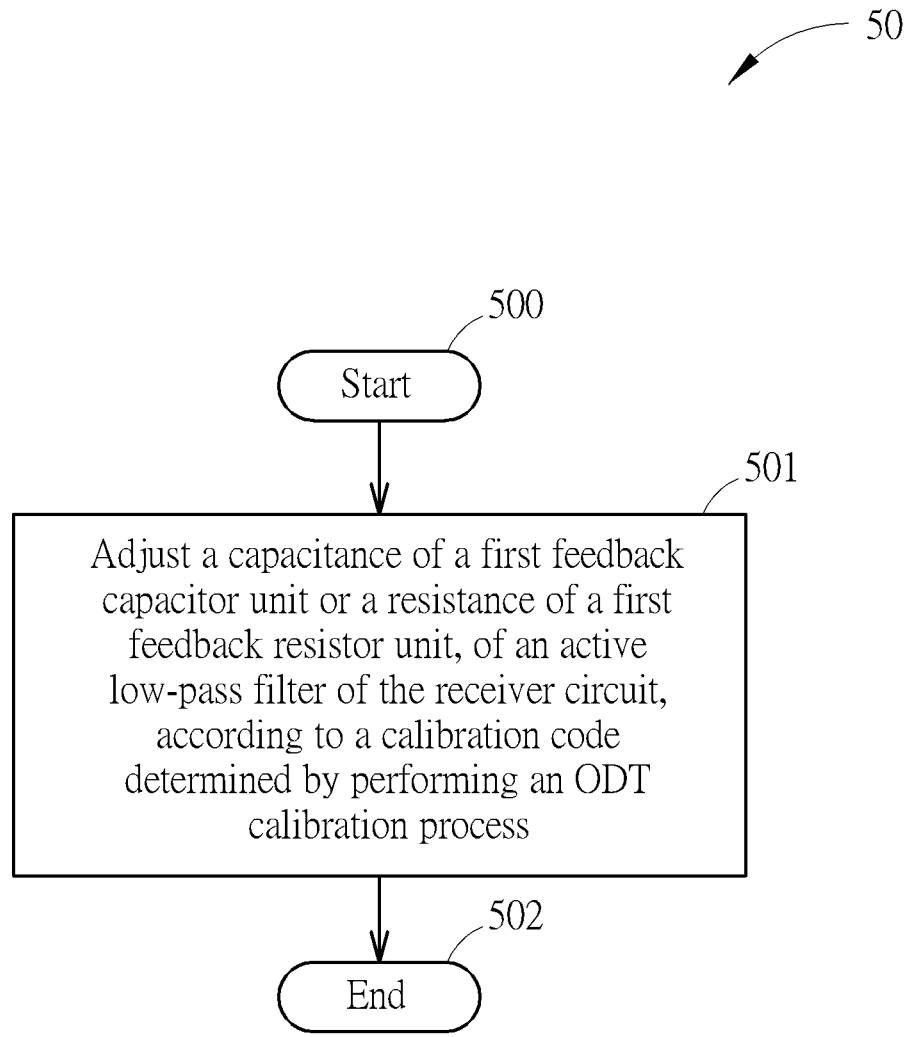
FIG. 5 is a flowchart of a process of bandwidth compensation according to an embodiment of the present invention.

FIG. 5 is a flowchart of a process 50 of bandwidth compensation according to an embodiment of the present invention. The process 50 may be implemented by a digital logic circuit in the electronic device 2. The process 50 includes the following steps:

Step 500: Start.
Step 501: Adjust a capacitance of a first feedback capacitor unit or a resistance of a first feedback resistor unit, of an active low-pass filter of the receiver circuit, according to a calibration code determined by performing an ODT calibration process.
Step 502: End.

Detailed operations of the Step 501 can be obtained by referring to descriptions regarding FIG. 2 to FIG. 4.

According to the embodiments of the present invention, the bandwidth of the active low-pass filter is compensated by adjusting at least one of the capacitance of the feedback capacitor units and the resistance of the feedback resistor units based on the calibration code determined by performing the ODT calibration process. Since the bandwidth is compensated based on the determined calibration code, there is no extra circuit area required for the calibration circuit dedicated to adjust the feedback capacitance and feedback resistance of the active low-pass filter, which saves cost of the electronic device.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An electronic device capable of bandwidth compensation, comprising:
   a register unit for storing a calibration code determined by performing an on-die termination (ODT) calibration process, wherein the calibration code is utilized for controlling a termination resistance of a ODT unit; and
   a data receiving circuit, comprising:
      an active low-pass filter comprising an operational amplifier, a first feedback resistor unit, a first feedback capacitor unit, and a first input resistor unit; and
      a first control circuit coupled to the register unit and the active low-pass filter, for generating a first control signal according to the calibration code stored in the register unit, the first control signal being utilized for adjusting a capacitance of the first feedback capacitor unit or a resistance of the first feedback resistor unit of the active low-pass filter.

2. The electronic device of claim 1, wherein the data receiving circuit further comprises:
   a second control circuit, coupled to the register unit and the ODT unit, for generating a second control signal which controls the termination resistance of the ODT unit according to the calibration code.

3. The electronic device of claim 1, wherein when the determined calibration code is different from a default calibration code, the capacitance of the first feedback capacitor unit is adjusted according to the determined calibration code.

4. The electronic device of claim 1, wherein when the determined calibration code is different from a default calibration code, the resistance of the first feedback resistor unit and the resistance of the first input resistor unit are adjusted according to the determined calibration code.

5. The electronic device of claim 1, wherein the active low-pass filter comprises:
   an operational amplifier comprising a inverting input terminal, a non-inverting input terminal, and a first output terminal;
   the first input resistor unit having one terminal coupled to one terminal of the ODT unit and another terminal coupled to the inverting input terminal of the operational amplifier;
   the first feedback resistor unit having one terminal coupled to the inverting input terminal of the operational amplifier and another terminal coupled to the first output terminal of the operational amplifier; and
   the first feedback capacitor unit having one terminal coupled to the inverting input terminal of the operational amplifier and another terminal coupled to the first output terminal of the operational amplifier.

6. The electronic device of claim 5, wherein the active low-pass filter is a single-ended active low-pass filter, the first feedback capacitor unit comprises a plurality of capacitors, and the active low-pass filter further comprises a plurality of switches utilized for controlling the number of parallel-coupled capacitors comprised in the first feedback capacitor unit.

7. The electronic device of claim 5, wherein the active low-pass filter is a single-ended active low-pass filter, the first feedback resistor unit comprises a plurality of resistors, and the active low-pass filter further comprises a plurality of first switches utilized for controlling the number of parallel-coupled resistors comprised in the first feedback resistor unit.

8. The electronic device of claim 7, wherein the first input resistor unit comprises a plurality of input resistors, and the active low-pass filter further comprises a plurality of second switches utilized for controlling the number of parallel coupled input resistors comprised in the first input resistor unit.

9. The electronic device of claim 5, wherein the active low-pass filter is a differential active low-pass filter, and the active low-pass filter further comprises:
   a second input resistor unit having one terminal coupled to another terminal of the ODT unit and another terminal coupled to the non-inverting input terminal of the operational amplifier;
   a second feedback resistor unit having one terminal coupled to the non-inverting input terminal of the operational amplifier and another terminal coupled to a second output terminal of the operational amplifier; and
   a second feedback capacitor unit having one terminal coupled to the non-inverting input terminal of the operational amplifier and another terminal coupled to the second output terminal of the operational amplifier.

10. The electronic device of claim 9, wherein the first feedback capacitor unit comprises a plurality of capacitors, the second feedback capacitor unit comprises a plurality of capacitors, and the active low-pass filter further comprises:
    a plurality of first switches utilized for controlling the number of parallel-coupled capacitors comprised in the first feedback capacitor unit; and
    a plurality of second switches utilized for controlling the number of parallel-coupled capacitors comprised in the second feedback capacitor unit.

11. The electronic device of claim 9, wherein the first feedback resistor unit comprises a plurality of resistors, the second feedback resistor unit comprises a plurality of resistors, and the active low-pass filter further comprises:
    a plurality of first switches utilized for controlling the number of parallel-coupled resistors comprised in the first feedback resistor unit; and
    a plurality of second switches utilized for controlling the number of parallel-coupled resistors comprised in the second feedback resistor unit.

12. The electronic device of claim 11, wherein the first input resistor unit comprises a plurality of resistors, the second input resistor unit comprises a plurality of resistors, and the active low-pass filter further comprises:
    a plurality of third switches utilized for controlling the number of parallel-coupled resistors comprised in the first input resistor unit; and
    a plurality of fourth switches utilized for controlling the number of parallel-coupled resistors comprised in the second input resistor unit.

13. A method of bandwidth compensation for a data receiving circuit of an electronic device, comprising:
    adjusting a capacitance of a first feedback capacitor unit or a resistance of a first feedback resistor unit, of an active low-pass filter of the data receiving circuit, according to a calibration code determined by performing an on-die termination (ODT) calibration process.

14. The method of claim 13, wherein at least one input terminal of the active low-pass filter is coupled to the ODT unit.

15. The method of claim 13, further comprising:
in response to adjusting the resistance of the first feedback resistor unit of the active low-pass filter, adjusting a resistance of a first input resistor unit of the active low-pass filter according to the calibration code to keep a gain of the active low-pass filter substantially the same.

16. The method of claim 13, wherein adjusting the capacitance of the first feedback capacitor unit of the active low-pass filter according to the determined calibration code comprises:
when the determined calibration code is different from a default calibration code, adjusting the capacitance of the first feedback capacitor unit according to the determined calibration code.

17. The method of claim 13, wherein adjusting the resistance of the first feedback resistor unit of the active low-pass filter according to the determined calibration code comprises:
when the determined calibration code is different from a default calibration code, adjusting the resistance of the first feedback resistor unit according to the determined calibration code.

* * * * *